United States Patent
Kawata

(10) Patent No.: US 12,284,754 B2
(45) Date of Patent: Apr. 22, 2025

(54) FLEXIBLE SUBSTRATE

(71) Applicant: Japan Display Inc., Tokyo (JP)

(72) Inventor: Yasushi Kawata, Tokyo (JP)

(73) Assignee: Japan Display Inc., Tokyo (JP)

( * ) Notice: Subject to any disclaimer, the term of this patent is extended or adjusted under 35 U.S.C. 154(b) by 294 days.

(21) Appl. No.: 17/806,830

(22) Filed: Jun. 14, 2022

(65) Prior Publication Data

US 2022/0312590 A1 Sep. 29, 2022

Related U.S. Application Data

(63) Continuation of application No. PCT/JP2020/039172, filed on Oct. 16, 2020.

(30) Foreign Application Priority Data

Dec. 16, 2019 (JP) .................................. 2019-226465

(51) Int. Cl.
*H05K 1/02* (2006.01)
*H05K 1/18* (2006.01)

(52) U.S. Cl.
CPC ......... *H05K 1/0296* (2013.01); *H05K 1/0274* (2013.01); *H05K 1/028* (2013.01); *H05K 1/189* (2013.01)

(58) Field of Classification Search
CPC ...... H05K 1/02; H05K 1/0296; H05K 1/0274; H05K 1/028; H05K 1/189
USPC ........................................................ 361/749
See application file for complete search history.

(56) References Cited

U.S. PATENT DOCUMENTS

| 2013/0099358 A1 | 4/2013 | Elolampi et al. |
| 2015/0282294 A1 | 10/2015 | Wakuda et al. |
| 2015/0282296 A1 | 10/2015 | Ogura et al. |
| 2018/0088390 A1 | 3/2018 | Ohara |
| 2021/0013431 A1 | 1/2021 | Kawata et al. |

FOREIGN PATENT DOCUMENTS

| JP | 2015-198101 A | 11/2015 |
| JP | 2015-198102 A | 11/2015 |
| JP | 2017-186619 A | 10/2017 |
| JP | 2018-54675 A | 4/2018 |
| JP | 2019-16814 A | 1/2019 |
| JP | 2019-175924 A | 10/2019 |

OTHER PUBLICATIONS

International Search Report issued Dec. 22, 2020 in PCT/JP2020/039172 filed on Oct. 16, 2020, 2 pages.

*Primary Examiner* — Tremesha W Burns
(74) *Attorney, Agent, or Firm* — Maier & Maier, PLLC

(57) ABSTRACT

According to one embodiment, a flexible substrate includes an insulating basement, a plurality of wiring lines, a plurality of electrical elements connected to the plurality of wiring lines, and a metal layer. The insulating basement includes a plurality of line portions supporting the plurality of wiring lines, and a plurality of island-shaped portions supporting the plurality of electrical elements. The plurality of line portions connect the plurality of island-shaped portions. The plurality of wiring lines and the electrical elements are located between the insulating basement and the metal layer.

13 Claims, 11 Drawing Sheets

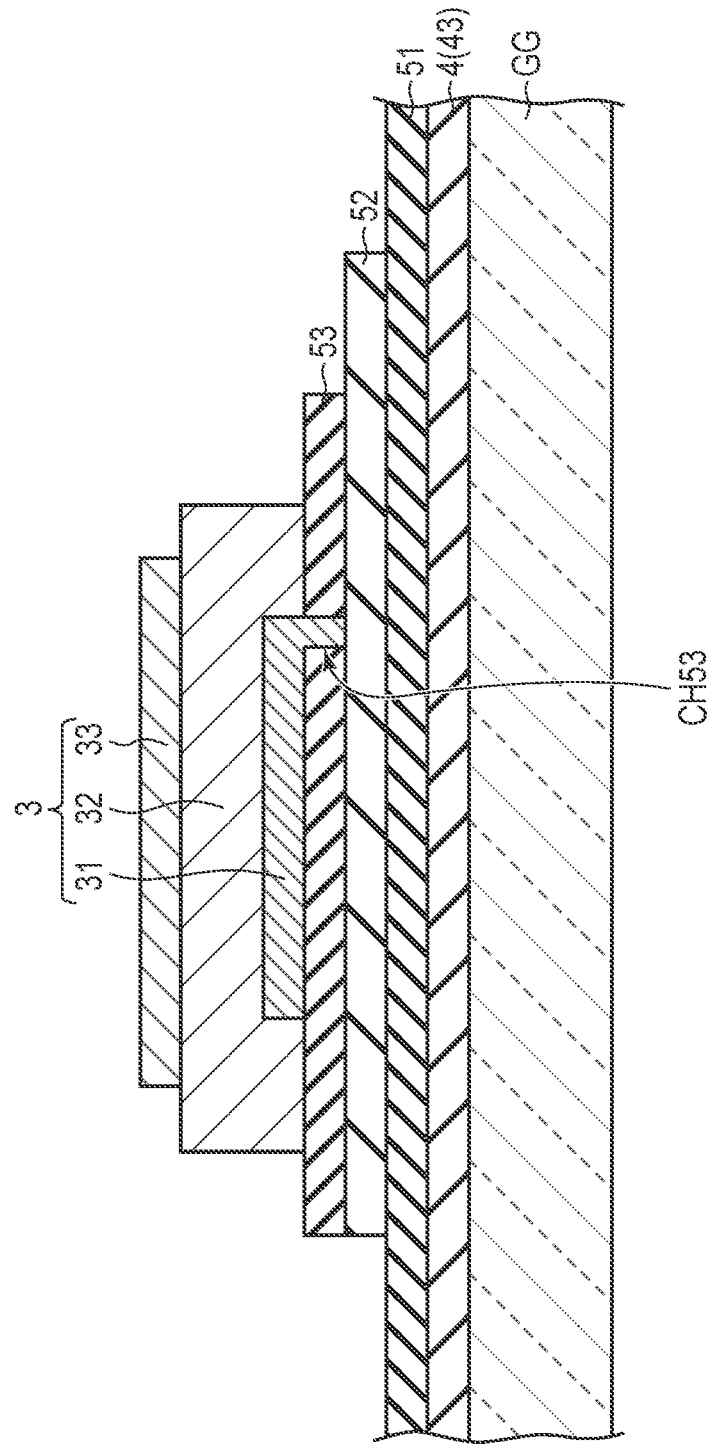
F I G. 12

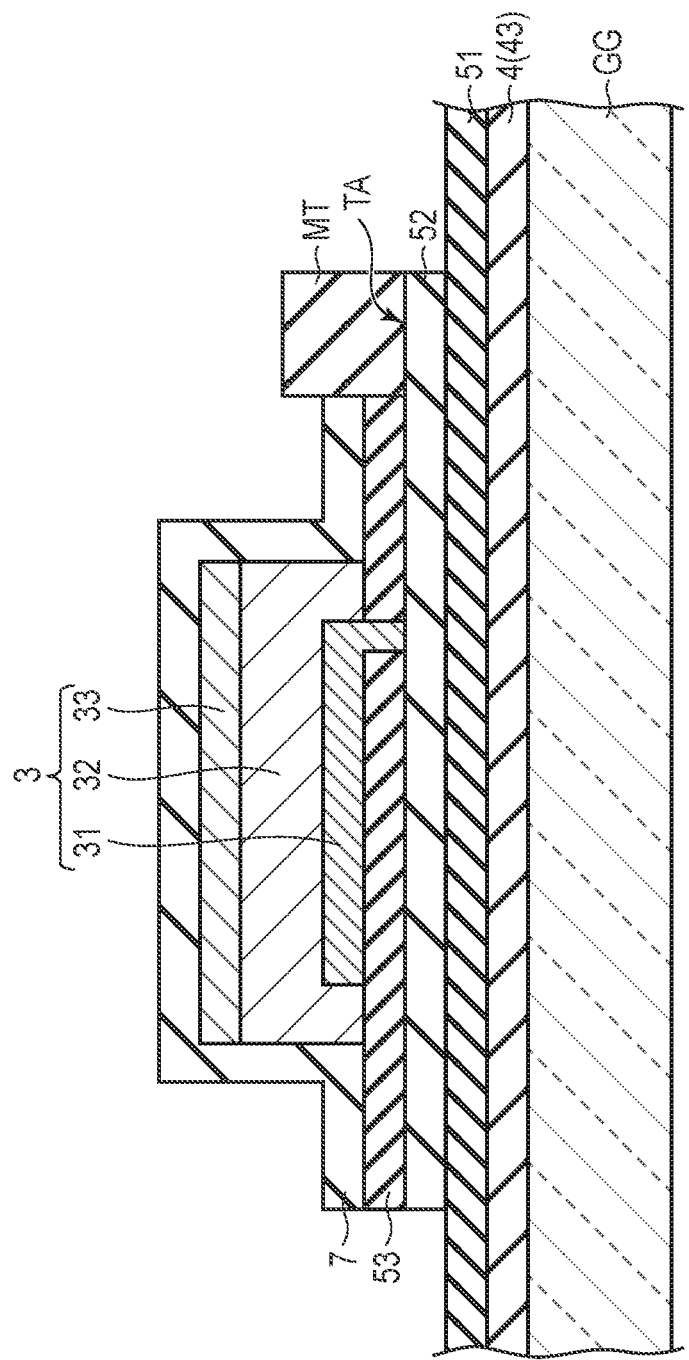
F I G. 13

FLEXIBLE SUBSTRATE

CROSS-REFERENCE TO RELATED APPLICATIONS

This application is a Continuation Application of PCT Application No. PCT/JP2020/039172, filed Oct. 16, 2020 and based upon and claiming the benefit of priority from Japanese Patent Application No. 2019-226465, filed Dec. 16, 2019, the entire contents of all of which are incorporated herein by reference.

FIELD

Embodiments described herein relate generally to a flexible substrate.

BACKGROUND

In recent years, use of flexible substrates having flexibility and elasticity has been studied in various fields. For example, attachment of a flexible substrate with electrical elements arrayed in a matrix, to a curved surface of a housing of an electronic device, a human body, or the like has been considered. For example, various sensors such as touch sensors and temperature sensors, and display elements can be applied as electrical elements.

In a flexible substrate, it is necessary to take measures to prevent the wiring lines from being damaged by stress caused by flexing and stretching. As such measures, for example, providing a honeycomb-shaped opening in a basement that supports wiring lines and forming the wiring lines in a meandering shape (meander shape) have been proposed.

BRIEF DESCRIPTION OF THE DRAWINGS

FIG. 12 is a cross-sectional view showing manufacturing processes of the flexible substrate according to the third embodiment.

FIG. 13 is a cross-sectional view showing the manufacturing processes following FIG. 12.

DETAILED DESCRIPTION

Figure 1:
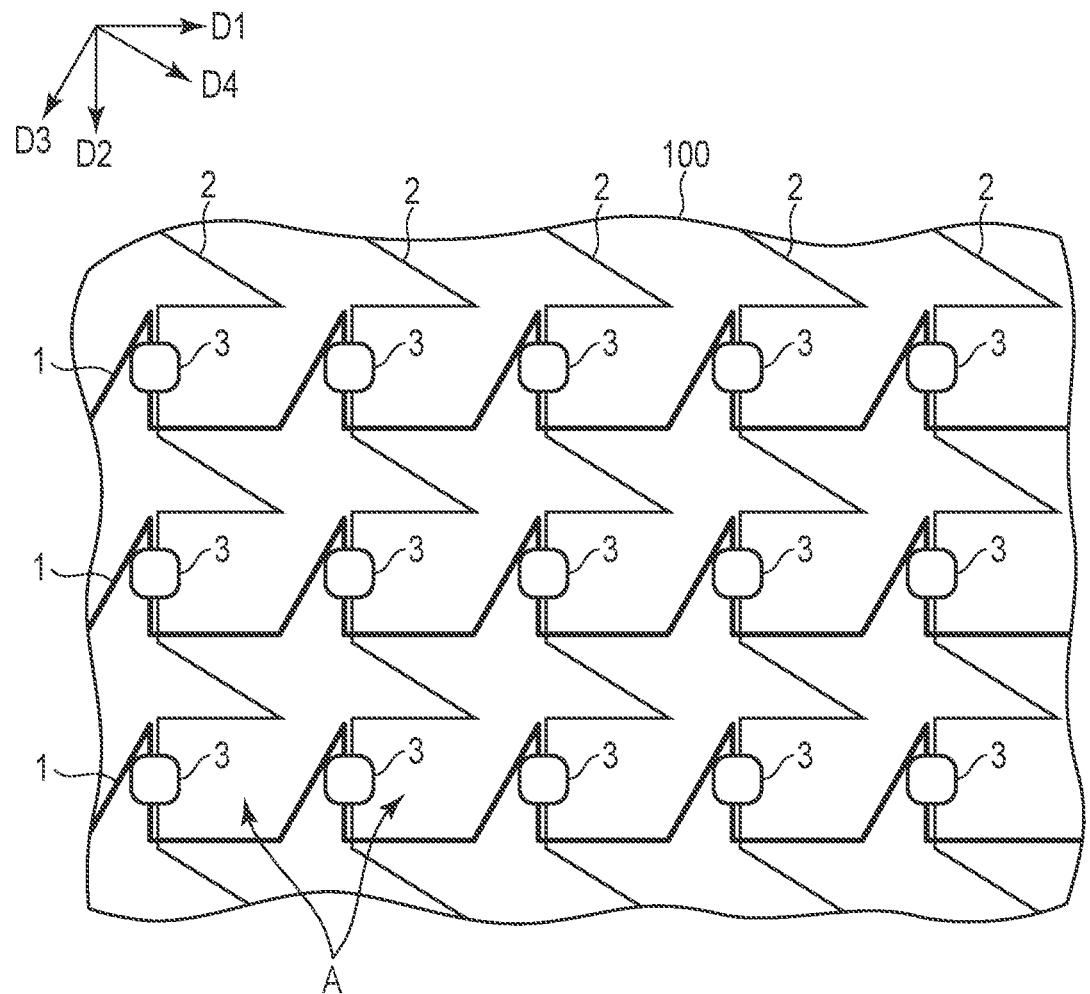
FIG. 1 is a schematic plan view showing a flexible substrate according to a first embodiment.

In general, according to one embodiment, there is provided a flexible substrate comprising: an insulating basement; a plurality of wiring lines provided on the insulating basement; a plurality of electrical elements connected to the plurality of wiring lines; and a metal layer, the insulating basement including a plurality of line portions supporting the plurality of wiring lines, and a plurality of island-shaped portions supporting the plurality of electrical elements, the plurality of line portions connecting the plurality of island-shaped portions, the plurality of wiring lines and the electrical elements being located between the insulating basement and the metal layer.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a schematic plan view showing a flexible substrate 100 according to a first embodiment. In this embodiment, a direction D1, a direction D2, a direction D3 and a direction D4 are defined as shown in the figure. The directions D1 to D4 are directions parallel to a main surface of the flexible substrate 100 and intersecting with each other. The direction D1 and the direction D2 intersect perpendicularly in the present embodiment, but may intersect at an angle other than the perpendicular angle. In addition, the direction D3 and the direction D4 intersect perpendicularly in the present embodiment, but may intersect at an angle other than the perpendicular angle.

The flexible substrate 100 comprises a plurality of scanning lines 1, a plurality of signal lines 2, and a plurality of electrical elements 3. The scanning lines 1 and the signal lines 2 are examples of the wiring lines which the flexible substrate 100 comprises. The scanning lines 1 and the signal lines 2 can be formed of, for example, a metal material or a transparent conductive material and may have a single-layer structure or a laminated structure. In addition to the scanning lines 1 and the signal lines 2, the flexible substrate 100 may comprise other types of wiring lines such as power lines for supplying power to the electrical elements 3.

The plurality of scanning lines 1 extend in the direction D1 as a whole and are arranged in the direction D2. The plurality of signal lines 2 extend in the direction D2 as a whole and are arranged in the direction D1. In the example illustrated, the scanning line 1 has a wavy shape in which straight portions parallel to the direction D1, straight portions parallel to the direction D3, and straight portions parallel to the direction D2 are repeated in order. Similarly, the signal line S has a wavy shape in which straight portions parallel to the direction D2, straight portions parallel to the direction D4, and straight portions parallel to the direction D1 are repeated in order.

A polygonal area A is formed by two adjacent scanning lines 1 and two adjacent signal lines 2. In the example illustrated, areas A of the same shape are repeated in directions D1 and D2.

The electrical elements 3 are electrically connected to the scanning lines 1 and the signal lines 2. In the example illustrated, the electrical elements 3 are disposed at parts where the scanning lines 1 and the signal lines 2 are parallel to the direction D2. However, the positions of the disposed electrical elements 3 are not limited to this example.

For example, the electrical element 3 is a sensor, a semiconductor element, a micro light emitting diode (LED), a display element, an actuator, or the like. For example, a temperature sensor, a pressure sensor, a touch sensor, or the like can be applied as the sensor. For example, a photoreceiver, a diode, a transistor, or the like can be applied as the semiconductor element. In addition, for example, an organic light emitting diode (OLED), a liquid crystal, or the like can be applied as the display element. The electrical element 3 is not limited to that illustrated here, but other elements comprising various functions can be applied. The electrical element 3 may be a capacitor, a resistor, or the like.

The scanning line 1 supplies a scanning signal to the electrical elements 3. For example, when the electrical elements 3 are elements for outputting signals such as sensors, the output signals from the electrical elements 3 are supplied to the signal line 2. In addition, for example, when the electrical elements 3 are elements operating in response to an input signal such as actuators, a drive signal is supplied to the signal line 2. A controller including a scanning signal supply source, a drive signal supply source, a processor for processing output signals, or the like may be provided on the flexible substrate 100 or may be provided in a device connected to the flexible substrate 100.

Figure 2:
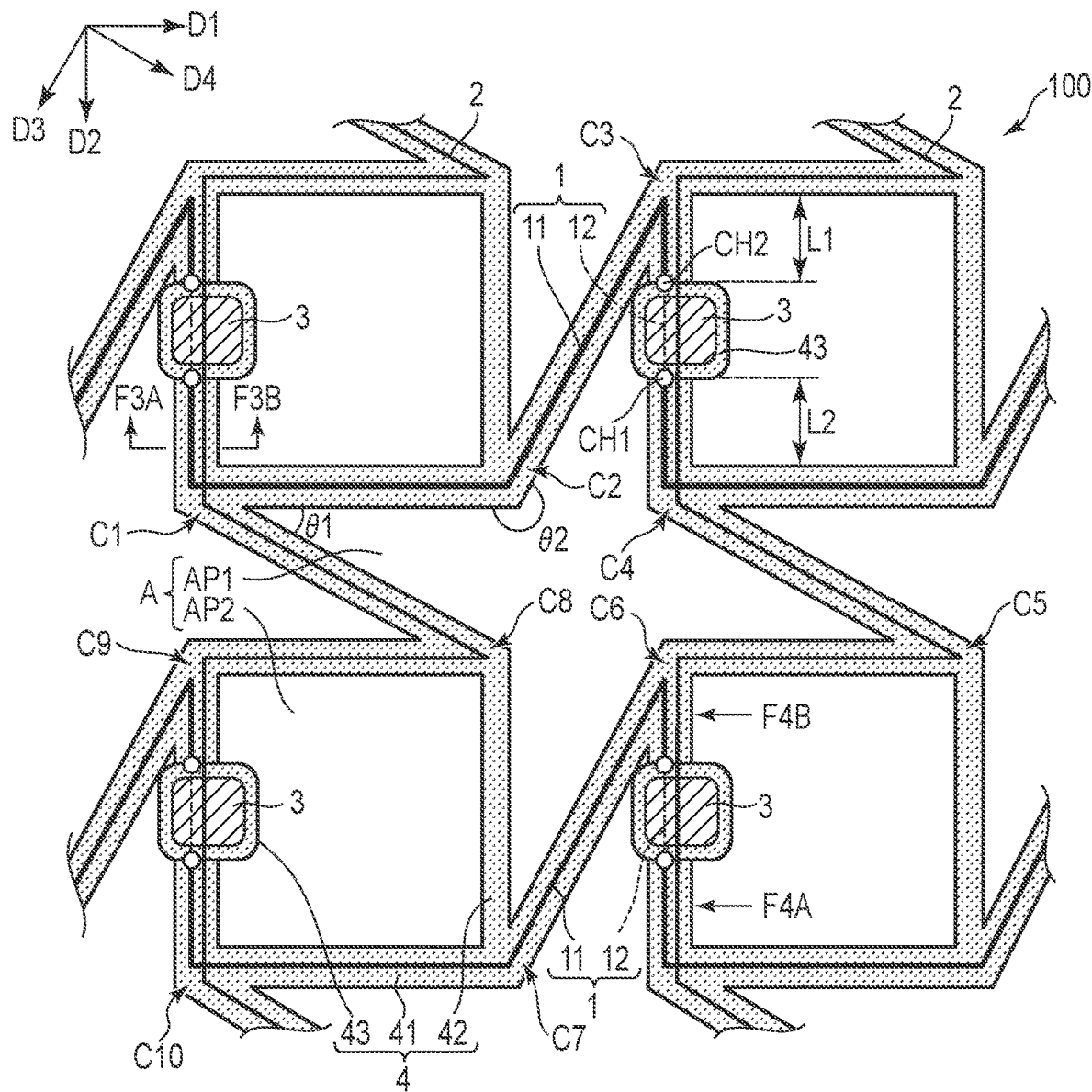
FIG. 2 is an enlarged plan view showing a part of the flexible substrate shown in FIG. 1.

FIG. 2 is an enlarged plan view showing a part of the flexible substrate 100 shown in FIG. 1. The figure shows a state that the scanning line 1 and the signal line 2 are close to each other and extend in parallel, in a vicinity of an electrical element 3 but, in reality, the scanning line 1 and the signal line 2 are stacked in a thickness direction of the flexible substrate 100 as described with reference to FIG. 3.

The flexible substrate 100 comprises a flexible insulating basement 4 that supports the scanning line 1 and the signal line 2. The insulating basement 4 can be formed of, for example, polyimide, but is not limited to this example.

The insulating basement 4 includes a plurality of line portions 41, a plurality of line portions 42, and a plurality of island-shaped portions 43, and is formed in a mesh shape. The line portion 41 overlaps with at least one of the scanning line 1 and the signal line 2. The line portion 42 does not overlap with either the scanning line 1 or the signal line 2. The line portion 41 and the line portion 42 have a linear shape. The island-shaped portion 43 overlaps with the electrical element 3 and is connected to the plurality of line portions 41.

Polygonal first openings AP1 and polygonal second openings AP2 having a different polygonal shape from the first opening AP1 are formed by the line portions 41 and the line portions 42. In the example illustrated, the first opening AP1 is shaped in a star-shaped octagon having eight corner portions C1 to C8. The second opening AP2 is shaped in a quadrangle having four corner portions C7 to C10. Each of the corner portions C1 to C10 is a portion where two or more line portions 41, or the line portion 41 and the line portion 42 are connected to each other at different angles. The shapes of the first opening AP1 and the second opening AP2 are not limited to these examples, but various shapes can be adopted.

In the example of FIG. 2, the number of the plurality of line portions 41 and 42 connected the line portion 42 between the first opening AP1 and the second opening AP2 to constitute the first opening AP1 is different from the number of the plurality of line portions 41 and 42 connected the line portion 42 between the first opening AP1 and the second opening AP2 to constitute the second opening AP2. However, the number of the line portions 41 and 42 constituting the first opening AP1 may be the same as the number of the line portions 41 and 42 constituting the second opening AP2.

Each of the line portion 41 between the corner portion C1 and the corner portion C2 and the line portion 41 between the corner portion C7 and the corner portion C10 overlaps with the corresponding scanning line 1 and is parallel to the first direction D1. Each of the line portion 41 between the corner portion C5 and the corner portion C6 and the line portion 41 between the corner portion C8 and the corner portion C9 overlaps with the corresponding signal line 2 and is parallel to the first direction D1.

Each of the line portion 41 between the corner portion C3 and the corner portion C4 and the line portion 41 between the corner portion C9 and the corner portion C10 overlaps with each of the corresponding scanning line 1 and the corresponding signal line 2, and is parallel to the second direction D2. The line portion 42 between the corner portion C7 and the corner portion C8 does not overlap with either the scanning line 1 or the signal line 2, and is parallel to the second direction D2.

Each of the line portion 41 between the corner portion C2 and the corner portion C3 and the line portion 41 between the corner portion C6 and the corner portion C7 overlaps with the corresponding scanning line 1 and is parallel to the third direction D3. Each of the line portion 41 between the corner portion C1 and the corner portion C8 and the line portion 41 between the corner portion C4 and the corner portion C5 overlaps with the corresponding signal line 2 and is parallel to the fourth direction D4.

Thus, the first opening AP1 and the second opening AP2 are constituted by the plurality of line portions 41 and 42 each extending in different four directions. The first opening AP1 and the second opening AP2 are included in one area A. The first opening AP1 and the second opening AP2 correspond to two areas obtained by dividing the area A with respect to the line portion 42. From another point of view, the line portion 42 is disposed at the boundary between the first opening AP1 and the second opening AP2. Three or more openings may be formed in the area A by providing two or more line portions 42 in the area A.

An internal angle $\theta 1$ of the first opening AP1 at each of the corner portions C1, C3, C5, and C7 is smaller than an internal angle $\theta 2$ of the first opening AP1 at each of the corner portions C2, C4, C6, and C8 ($\theta 1 < \theta 2$). In the example illustrated, the internal angle $\theta 1$ is an acute angle ($\theta 1 < 90°$) and the internal angle $\theta 2$ is an angle exceeding 180° ($\theta 2 > 180°$).

The shape of the first opening AP1 is 4-fold symmetric, which becomes the same shape when rotated by 90°. The shape is not limited to this example, but the first opening AP1 may have four or more rotational symmetries such as 5-fold symmetry and 6-fold symmetry. In addition, the first opening AP1 may have a three or less-fold symmetry.

The island-shaped portion 43 is disposed near a center of the line portion 41 that overlaps with the scanning line 1 and the signal line 2. The electrical element 3 is disposed above the island-shaped portion 43. The island-shaped portion 43 is larger than the electrical element 3 and, in FIG. 2, the island-shaped portion 43 protrudes from an outer edge of the electrical element 3. For example, when the line portion 41 between the corner portions C3 and C4 is focused, a length L1 from an upper end portion of the line portion 41 to the island-shaped portion 43 in the figure and a length L2 from a lower end portion of the line portion 41 to the island-shaped portion 43 in the figure are equal to each other. However, the length L1 and the length L2 may be different from each other.

The scanning line 1 includes first portions 11 represented by solid lines and second portions 12 represented by dashed lines. The second portion 12 overlaps with the electrical element 3. The first portions 11 and the second portions 12 are disposed in layers different from each other and are electrically connected through contact holes CH1 and CH2.

Figure 3:
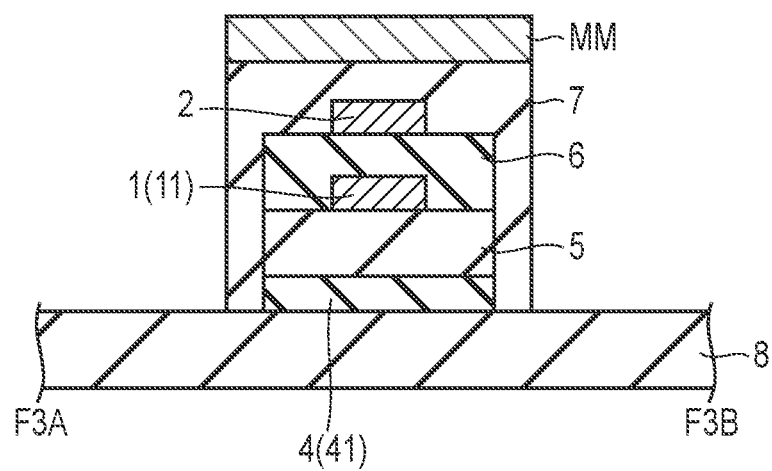
FIG. 3 is a cross-sectional view showing a part of the flexible substrate as viewed along F3A-F3B in FIG. 2.

FIG. 3 is a cross-sectional view showing a part of the flexible substrate 100 as viewed along F3A-F3B in FIG. 2. In addition to the above-described elements, the flexible substrate 100 further comprises a first organic insulating layer 5, a second organic insulating layer 6, a coating layer 7, a support film 8, and a metal layer MM. Both the first organic insulating layer 5 and the second organic insulating layer 6 are formed of an organic material. The coating layer 7 is formed of, for example, parylene (polyparaxylylene). The metal layer MM is formed of a metal material.

The first insulating layer 5 is provided on the insulating basement 4. The scanning line 1 (first portion 11) is disposed on the first organic insulating layer 5. The second organic insulating layer 6 is provided on the first organic insulating layer 5 and covers the scanning line 1. The signal line 2 is disposed on the second organic insulating layer 6. The coating layer 7 covers the signal line 2, the first organic insulating layer 5 and the second organic insulating layer 6, and is in contact with an upper surface of the support film 8. The coating layer 7 is located directly above the insulating basement 4. The metal layer MM is located directly above the insulating basement 4 and is provided on the coating layer 7. The metal layer MM is closely adhered the coating layer 7. The scanning line 1 and the signal line 2 are located between the insulating basement 4 and the metal layer MM.

The insulating basement 4 is located between the support film 8 and the metal layer MM, and the support film 8 supports the insulating basement 4. The support film 8 overlaps with the plurality of line portions 41 and 42, first openings AP1, and second openings AP2 in planar view. The support film 8 may be attached to, for example, a lower surface of the insulating basement 4 via an adhesive layer. The strength of the flexible substrate 100 can be increased as a whole and infiltration of moisture from below can be suppressed by providing the support film 8.

The first organic insulating layer 5 and the second organic insulating layer 6 may also be provided in areas (first openings AP1 and second openings AP2) where the insulating basement 4 is not provided. From the viewpoint of the flexibility and elasticity of the flexible substrate 100, however, the disposing mode as shown in FIG. 3 is desirable.

Figure 4:
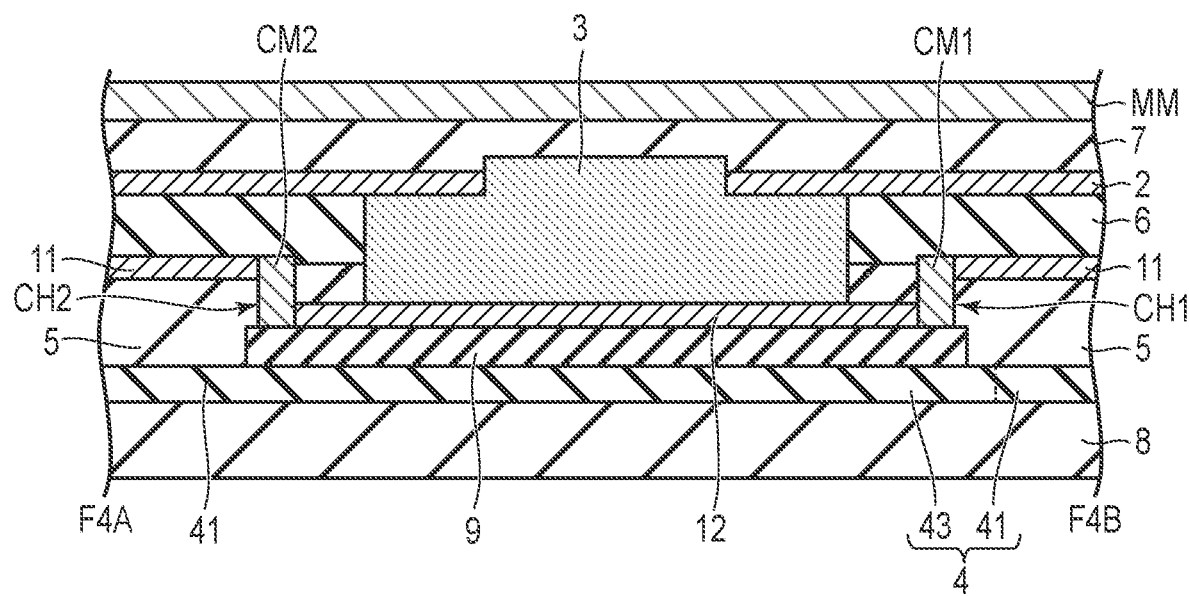
FIG. 4 is a cross-sectional view showing a part of the flexible substrate as viewed along F4A-F4B in FIG. 2.

FIG. 4 is a cross-sectional view showing a part of the flexible substrate 100 as viewed along F4A-F4B in FIG. 2. An inorganic insulating layer 9 is formed between the electrical element 3 and the island-shaped portion 43. The inorganic insulating layer 9 is formed in an island shape which overlaps with the electrical element 3 in planar view.

The first portion 11 of the scanning line 1 is disposed on the first organic insulating layer 5. The second portion 12 of the scanning line 1 is disposed on the inorganic insulating layer 9 (i.e., under the first organic insulating layer 5). The second portion 12 is electrically connected to the electrical element 3.

The above-described contact holes CH1 and CH2 are provided in the first organic insulating layer 5 in an area which overlaps with the island-shaped portion 43 and the inorganic insulating layer 9 in planar view. The first portion 11 of the scanning line 1 is electrically connected to the second portion 12 via the connecting members CM1 and CM2 that are disposed in the contact holes CH1 and CH2, respectively. The connecting members CM1 and CM2 may be parts of the first portion 11 or may be provided separately from the first portion 11.

The metal layer MM extends along the insulating basement 4 and is formed in a mesh shape overlapping with the insulating basement 4 in planar view. The coating layer 7 is located between the metal layer MM and the insulating basement 4, and extends along the insulating basement 4 (line portions 41, line portions 42, and island-shaped portions 43). The wiring line (scanning line 1 or signal line 2) and the electrical element 3 are located between the insulating basement 4 and the metal layer MM and between the insulating basement 4 and the coating layer 7. The electrical element 3 is located between the inorganic insulating layer 9 and the metal layer MM.

According to this embodiment, the electrical element 3 is located between the inorganic insulating layer 9 and the metal layer MM. The infiltration of moisture into the electrical element 3 from above can be suppressed by the metal layer MM, and the infiltration of moisture into the electrical element 3 from below can be suppressed by the inorganic insulating layer 9. Deterioration of the electrical element 3 due to the infiltration of moisture can be thereby suppressed. Furthermore, each of the electrical element 3, the signal line, and the scanning line is located between the insulating basement 4 and the metal layer MM. It is possible to prevent static electricity and an electric field from the outside from acting on the electrical element 3 by the metal layer MM. A flexible substrate capable of improving reliability can be thereby provided.

Next, a second embodiment will be described. The configuration and advantages not specifically mentioned are the same as those in the first embodiment.

Figure 5:
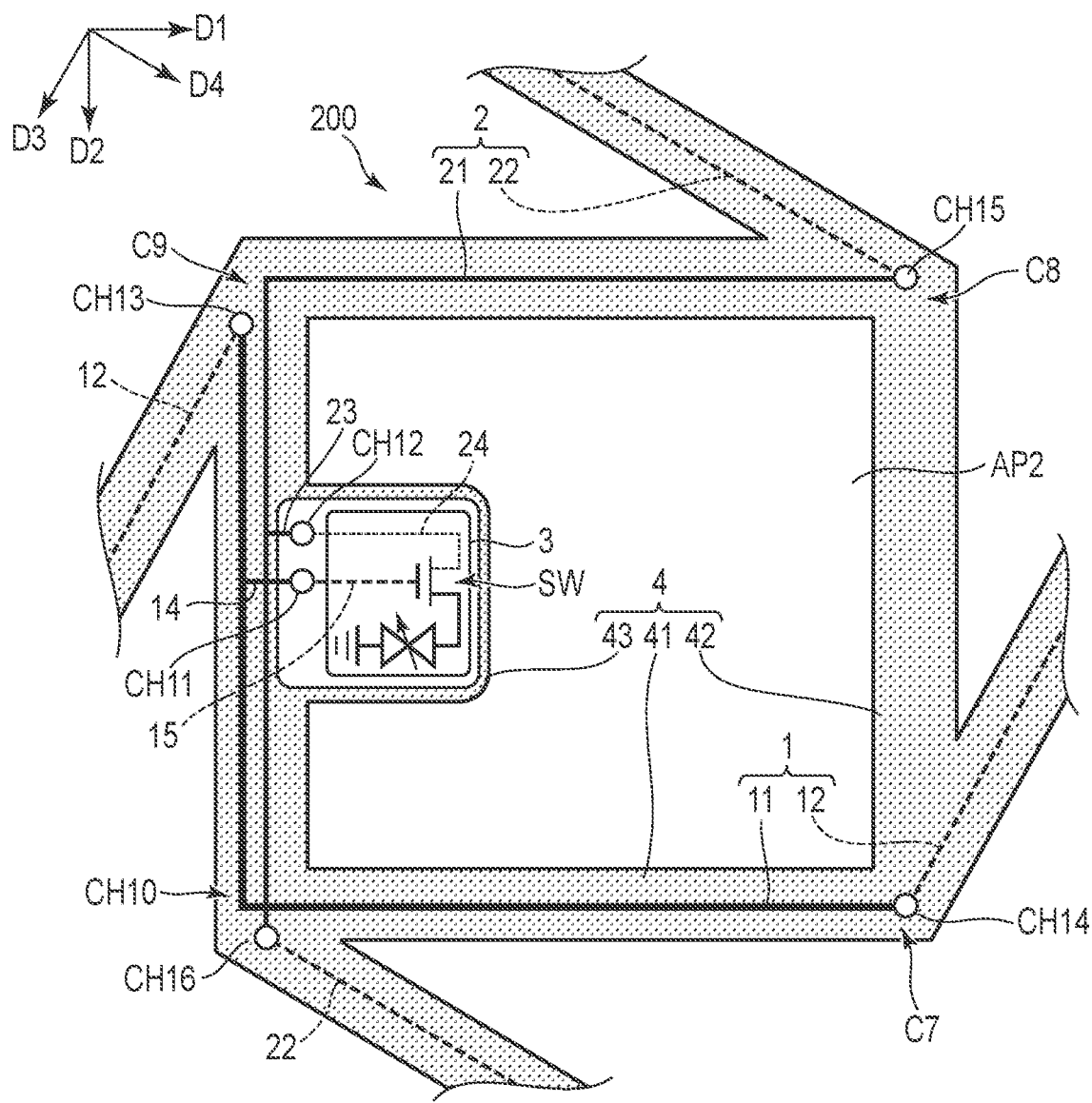
FIG. 5 is a plan view showing a flexible substrate according to a second embodiment.

FIG. 5 is a plan view showing a flexible substrate 200 according to the second embodiment. The planar shapes of the scanning lines 1, the signal lines 2, and the insulating basement 4 are the same as those in FIG. 2, and the second opening AP2 including corner portions C7 to C10 and a vicinity thereof are enlarged in FIG. 5.

In this embodiment, the first portion 11 of the scanning line 1 is disposed between the corner portion C9 and the corner portion C10 and between the corner portion C10 and the corner portion C7. The other portion of the scanning line 1 that overlaps with the line portion 41 is the second portion 12 disposed in a layer different from that of the first portion 11. The electrical element 3 is disposed inside the second opening AP2 in the vicinity of the line portion 41 between the corner portion C9 and the corner portion C10.

The signal line 2 includes a first portion 21 represented by a solid line and second portions 22 represented by dashed lines. The first portion 21 and the second portions 22 are disposed in layers different from each other. In the example illustrated, the first portion 21 is disposed between the corner portion C8 and the corner portion C9 and between the corner portion C9 and the corner portion C10. The other portion of the signal line 2 that overlaps the line portion 41 is the second portion 22.

The scanning line 1 includes an extending portion 14 and an extending portion 15 in the vicinity of the electrical element 3. The extending portion 14 and the extending portion 15 are electrically connected to each other through a contact hole CH11. The extending portion 14 is disposed in the same layer as the first portion 11, and the extending portion 15 is disposed in the same layer as the second portion 12.

The signal line 2 includes an extending portion 23 and an extending portion 24 in the vicinity of the electrical element 3. The extending portion 23 and the extending portion 24 are electrically connected to each other through a contact hole CH12. The extending portion 23 is disposed in the same layer as the first portion 21, and the extending portion 24 is disposed in the same layer as the second portion 22.

The extending portion 15 is connected to a gate of a switching element SW. The extending portion 24 is connected to a source or drain of the switching element SW.

At the corner portion C9, the first portion 11 and the second portion 12 are electrically connected through a contact hole CH13. At the corner portion C7, the first portion 11 and the second portion 12 are electrically connected to each other through a contact hole CH14. At the corner portion C8, the first portion 21 and the second portion 22 are electrically connected to each other through a contact hole CH15. At the corner portion C10, the first portion 21 and the second portion 22 are electrically connected to each other through a contact hole CH16.

Figure 6:
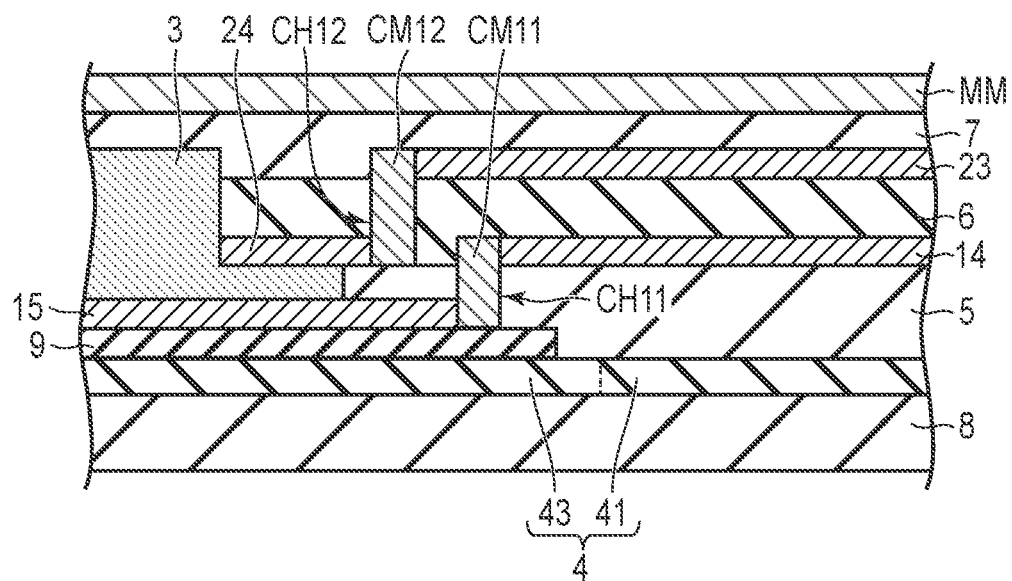
FIG. 6 is a cross-sectional view showing connection of each of a scanning line, a signal line, and an electrical element shown in FIG. 5.

FIG. 6 is a cross-sectional view showing a connection mode of each of the scanning line 1, the signal line 2, and the electrical element 3 shown in FIG. 5. For simplification of the description, the extending portion 14, the extending portion 15, and the contact hole CH11, and, the extending portion 23, the extending portion 24, and the contact hole CH12 are shown in the same cross section.

The contact hole CH11 is provided in the first organic insulating layer 5. The contact hole CH12 is provided in the second organic insulating layer 6. The contact holes CH11 and CH12 overlap with the island-shaped portion 43 and the inorganic insulating layer 9, respectively, in planar view. The extending portion 14 and the extending portion 15 are electrically connected to each other via a connecting member CM11 disposed in the contact hole CH11. The extending portion 23 and the extending portion 24 are electrically connected via a connecting member CM12 disposed in the contact hole CH12. The connecting member CM11 may be a part of the extending portion 14 or may be provided separately from the extending portion 14. Similarly, the connecting member CM12 may be a part of the extending portion 23 or may be provided separately from the extending portion 23. The extending portion 14, the extending portion 15, and the connecting member CM11, and, the extending portion 23, the extending portion 24, and the connecting member CM12 are located between the insulating basement 4 and the metal layer MM.

Figure 7:
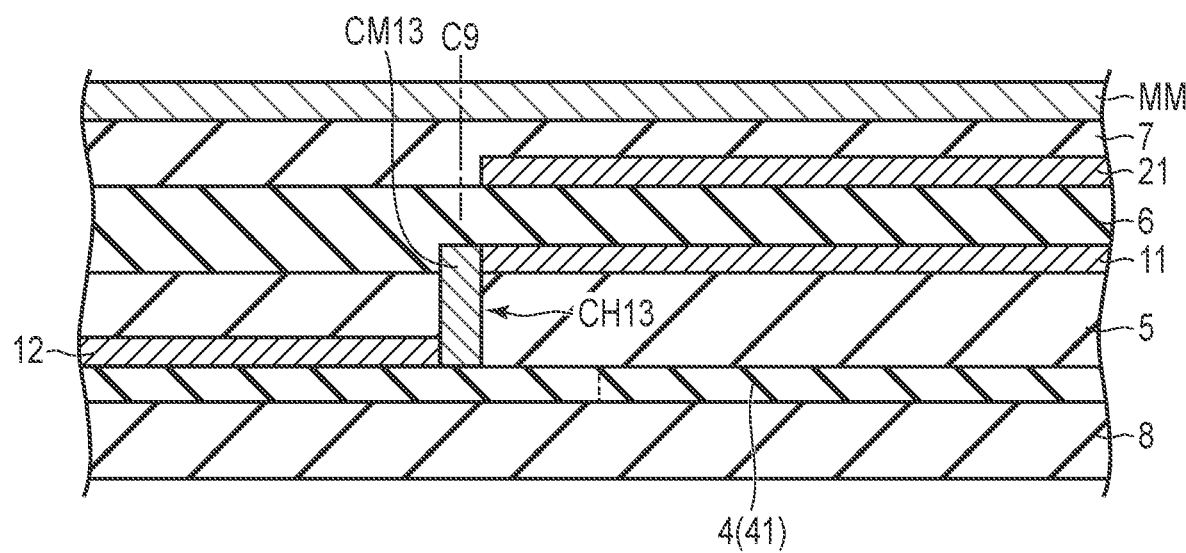
FIG. 7 is a cross-sectional view showing the flexible substrate along the scanning line near a corner portion C9.

FIG. 7 is a cross-sectional view showing a flexible substrate 200 as viewed along the scanning line 1 near the corner portion C9. The first portion 11 is disposed on the first organic insulating layer 5. The second portion 12 is disposed on the insulating basement 4 (line portion 41). The contact hole CH13 is provided in the first organic insulating layer 5. The first portion 11 and the second portion 12 are electrically connected to each other via a connecting member CM13 disposed in the contact hole CH13. The first portion 11, the second portion 12, the connecting member CM13, and the first portion 21 are located between the insulating basement 4 and the metal layer MM.

Figure 8:
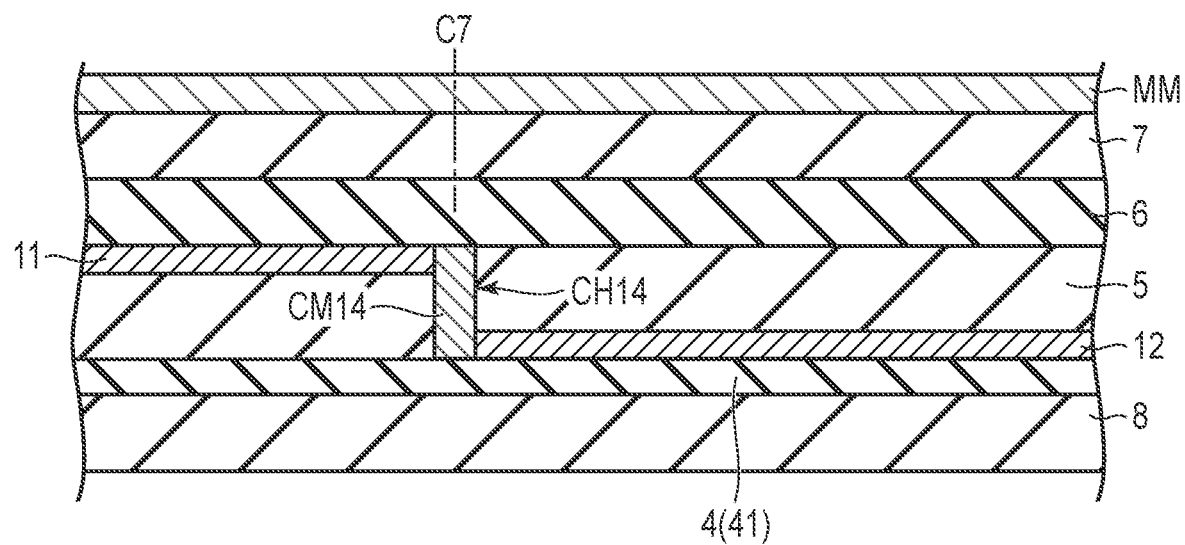
FIG. 8 is a cross-sectional view showing the flexible substrate along the scanning line near a corner portion C7.

FIG. 8 is a cross-sectional view showing the flexible substrate 200 as viewed along the scanning line 1 near the corner portion C7. The contact hole CH14 is provided in the first organic insulating layer 5. The first portion 11 and the second portion 12 are electrically connected to each other via a connecting member CM14 disposed in the contact hole CH14. The first portion 11, the second portion 12, and the connecting member CM14 are located between the insulating basement 4 and the metal layer MM.

Figure 9:
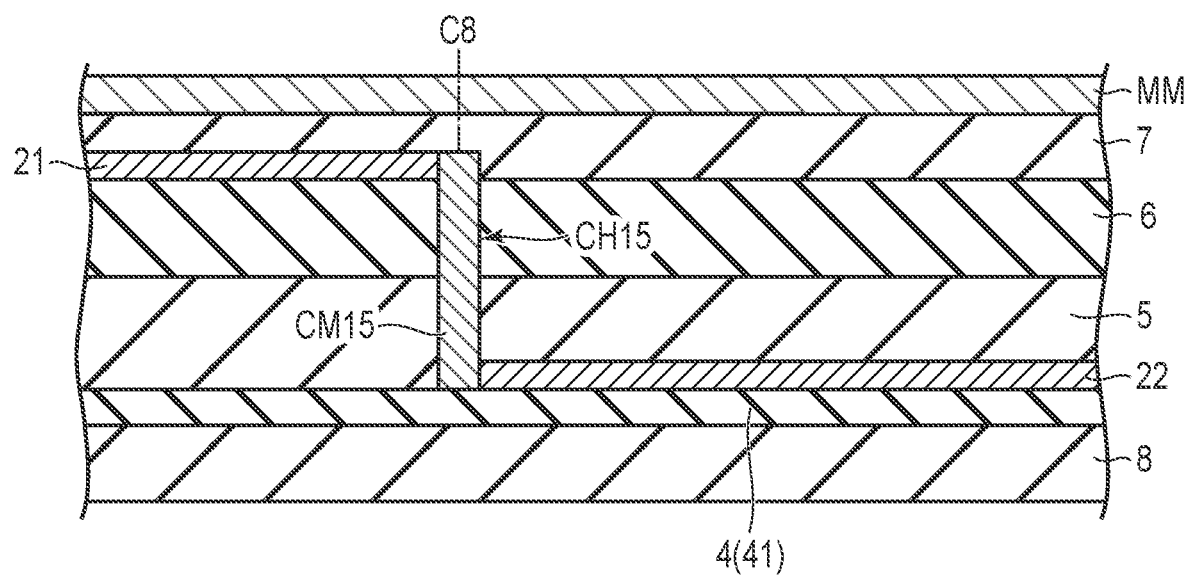
FIG. 9 is a cross-sectional view showing the flexible substrate along the signal line near a corner portion C8.

FIG. 9 is a cross-sectional view showing the flexible substrate 200 as viewed along the signal line 2 near the corner portion C8. The first portion 21 is disposed on the second organic insulating layer 6. The second portion 22 is disposed on the insulating basement 4 (line portion 41). The contact hole CH15 is provided in each of the first organic insulating layer 5 and the second organic insulating layer 6. The first portion 21 and the second portion 22 are electrically connected to each other via a connecting member CM15 disposed in the contact hole CH15. The first portion 21, the second portion 22, and the connecting member CM15 are located between the insulating basement 4 and the metal layer MM.

Figure 10:
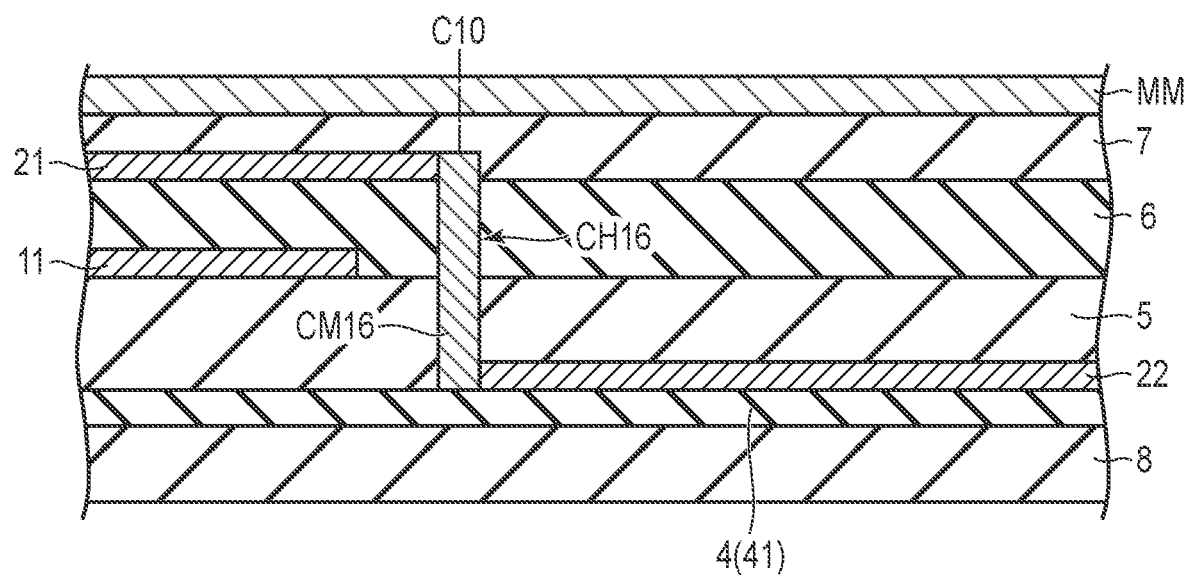
FIG. 10 is a cross-sectional view showing the flexible substrate along the signal line near a corner portion C10.

FIG. 10 is a cross-sectional view showing the flexible substrate 200 as viewed along the signal line 2 near the corner portion C10. The contact hole CH16 is provided in each of the first organic insulating layer 5 and the second organic insulating layer 6. The first portion 21 and the second portion 22 are electrically connected to each other via a connecting member CM16 disposed in the contact hole CH16. The first portion 21, the second portion 22, the connecting member CM16, and the first portion 11 are located between the insulating basement 4 and the metal layer MM.

The connecting member CM11, the connecting member CM13, and the connecting member CM14 may be parts of the first portion 11 or may be provided separately from the first portion 11. In addition, the connecting member CM12, the connecting member CM15, and the connecting member CM16 may be parts of the first portion 21 or may be provided separately from the first portion 21.

Next, a third embodiment will be described. An electrical element 3 of the third embodiment is, for example, an organic photodetector (OPD). The electrical element 3 may be an organic photovoltaic (OPV) cell. The configuration and advantages not specifically mentioned are the same as those in the above-described embodiments.

Figure 11:
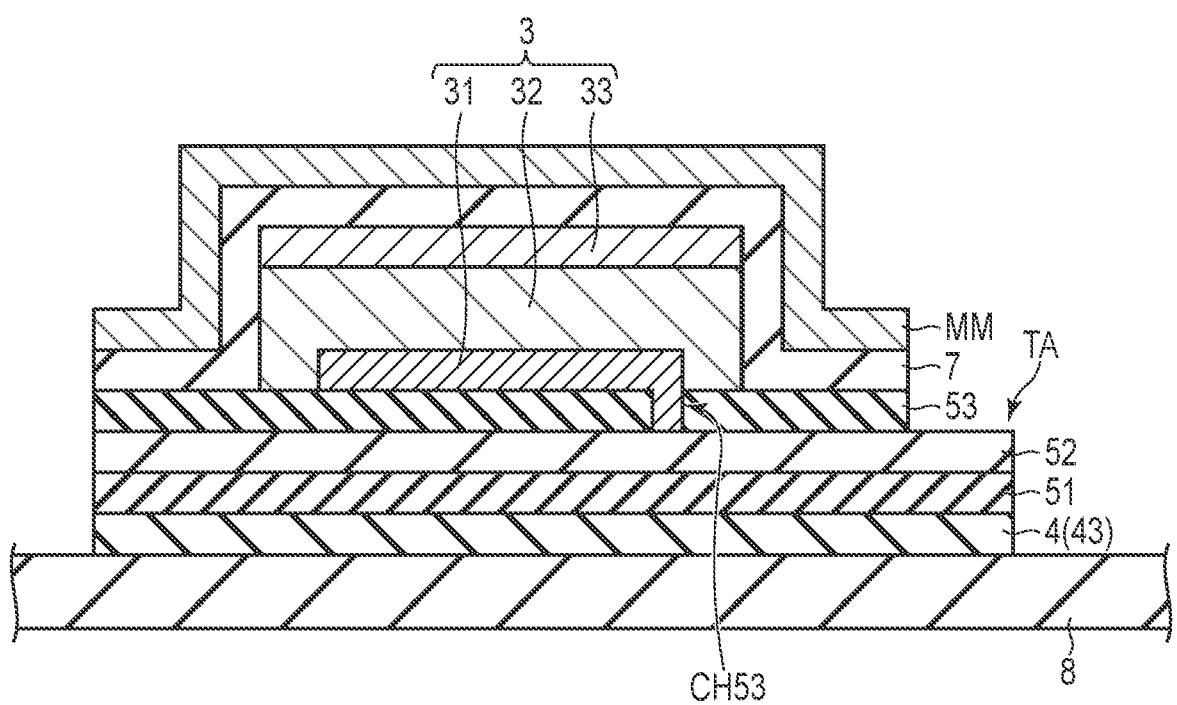
FIG. 11 is a cross-sectional view showing a flexible substrate according to a third embodiment.

FIG. 11 is a cross-sectional view showing a flexible substrate 300 according to a third embodiment. An inorganic insulating layer 51 is provided on an island-shaped portion 43 of an insulating basement 4. A TFT layer 52 is provided on the inorganic insulating layer 51 and is covered with a flattening layer 53. The TFT layer 52 includes layers on which the switching element SW, the scanning line 1, and the signal line 2 are formed, respectively. In addition, an area TA which is not covered with the flattening layer 53, on the TFT layer 52, functions as a terminal portion and can be connected to other lines. The flattening layer 53 is provided on the TFT layer 52. A contact hole CH53 is provided in the flattening layer 53. The flattening layer 53 is formed of an organic material.

The electrical element 3 is located on the flattening layer 53. The electrical element 3 comprises a transparent electrode 31, an active layer 32, and a reflective electrode 33. The transparent electrode 31 is provided on the flattening layer 53 and is electrically connected to the switching element SW of the TFT layer 52 through the contact hole CH53. The transparent electrode 31 is a transparent electrode formed of a transparent conductive material such as indium tin oxide (ITO) or indium zinc oxide (IZO). In the example illustrated, the active layer 32 is provided on the flattening layer 53 and covers the transparent electrode 31. The active layer 32 is composed of an electron donor (p-type semiconductor) and an electron acceptor (n-type semiconductor) formed of an organic material. The reflective electrode 33 is provided on the active layer 32 and is opposed to the transparent electrode 31. The reflective electrode 33 is formed of, for example, a non-corrosive metal such as silver (Ag) or gold (Au).

Although not shown, an electron transport layer is formed between the transparent electrode 31 and the active layer 32, and a hole transport layer is formed between the reflective electrode 33 and the active layer 32. The active layer 32 and the reflective electrode 33 are covered with a coating layer 7. Deterioration of the electrical element 3 due to oxygen and moisture can be thereby suppressed. The metal layer MM is provided on the coating layer 7 and is closely adhered the coating layer 7. The metal layer MM is electrically connected to the reflective electrode 33. The metal layer MM functions as an auxiliary feeding end of the reflective electrode 33, and can contribute to reducing a wiring resistance of the reflective electrode 33.

The electrical element 3 is located directly below the metal layer MM. Since the light directed from an upper side (metal layer MM) of the figure to the electrical element 3 is blocked by the metal layer MM, the electrical element 3 can receive light from an lower side (support film 8) of the figure without being affected by the light from the upper side of the figure.

FIG. 12 to FIG. 15 are cross-sectional views showing processes of a method of manufacturing a flexible substrate 300 in order. First, in FIG. 12, a glass substrate GG is prepared. The TFT layer 52 and the electrical element 3 are formed on the glass substrate GG. In the illustrated example, a part of the active layer 32 is exposed from the reflective electrode 33. The active layer 32 is patterned using the reflective electrode 33 as a mask.

In FIG. 13, the area TA not covered by the flattening layer 53 on an upper surface of the TFT layer 52 is covered with a masking tape MT. Then, the coating layer 7 is formed by chemical vapor deposition (CVD).

Figure 14:
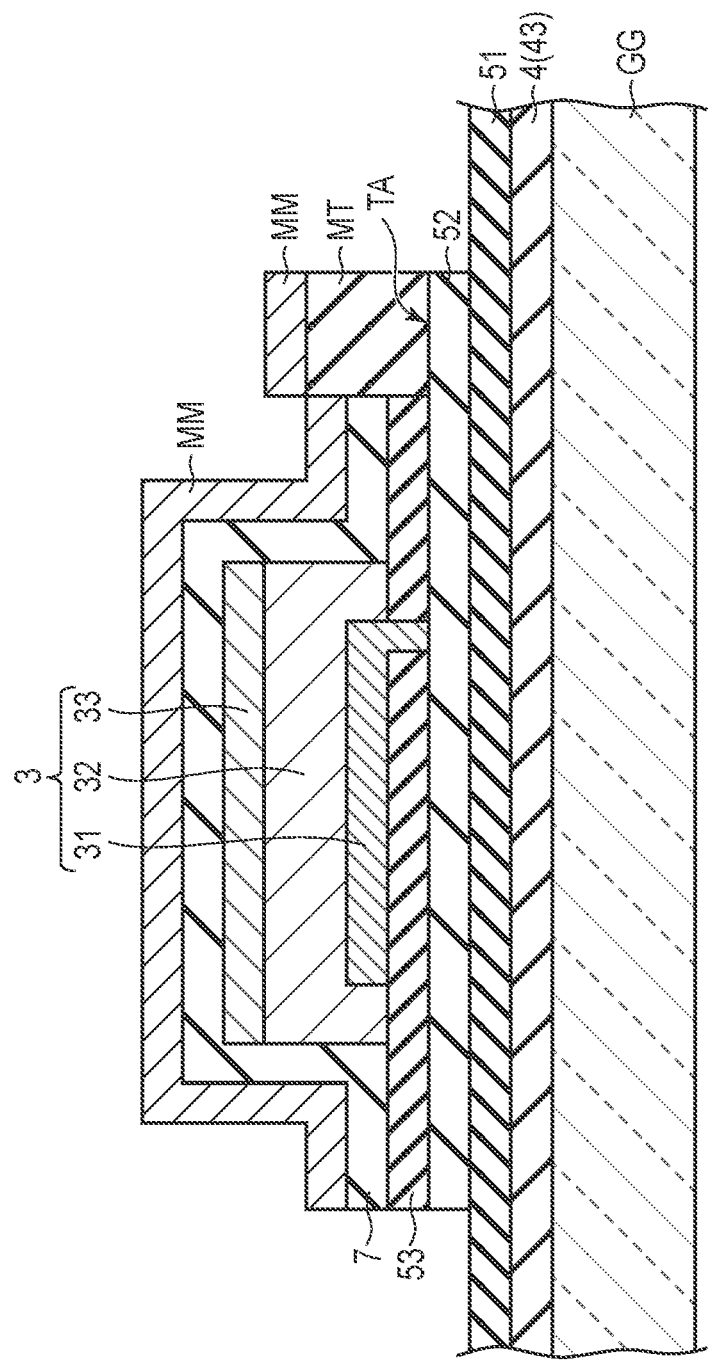
FIG. 14 is a cross-sectional view showing the manufacturing processes following FIG. 13.
Figure 15:
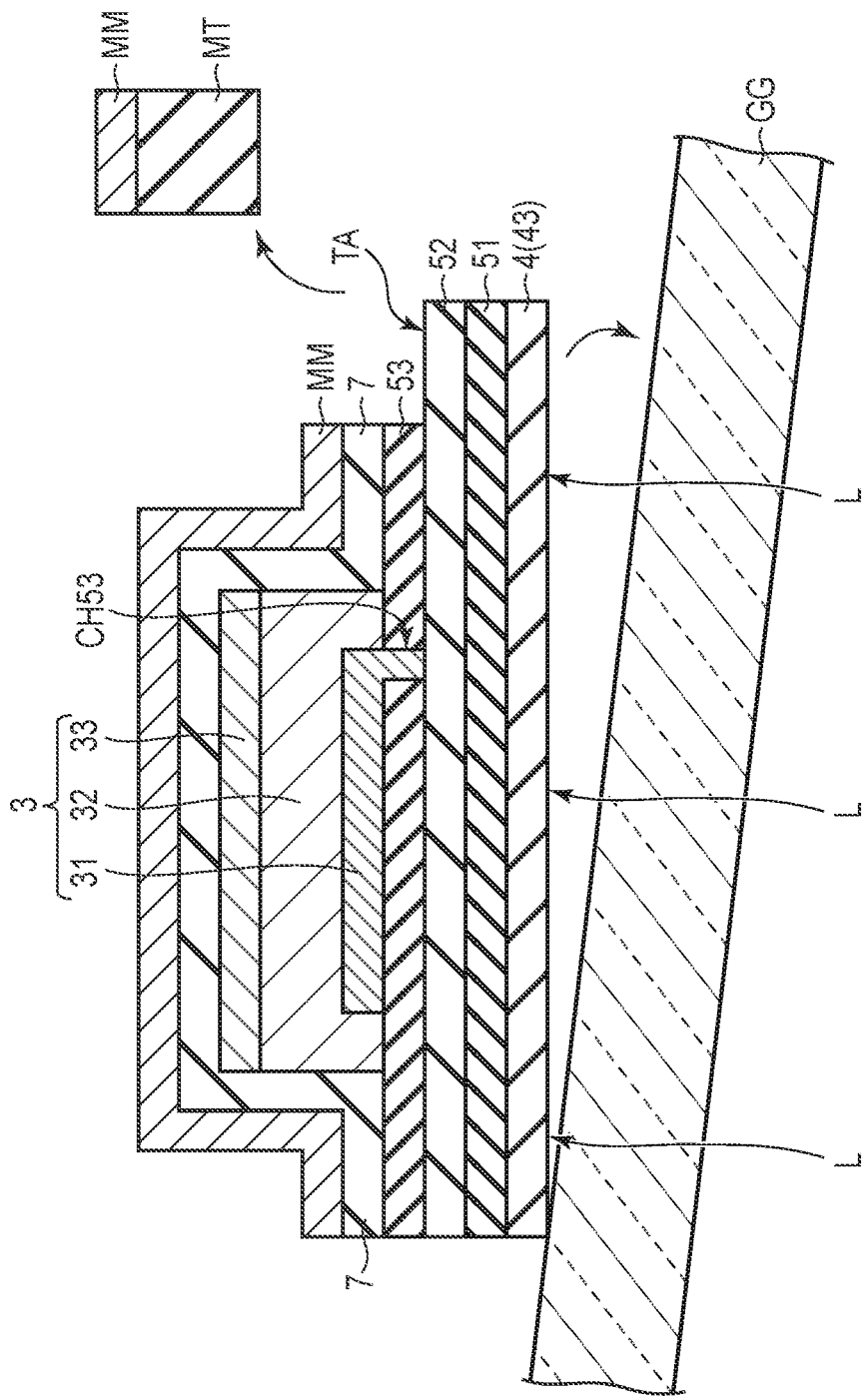
FIG. 15 is a cross-sectional view showing the manufacturing processes following FIG. 14.

In FIG. 14, the metal layer MM is formed on each of the coating layer 7 and the masking tape MT. In FIG. 15, the insulating basement 4 and the inorganic insulating layer 51 are collectively patterned by, for example, dry etching or laser ablation, using the metal layer MM as a mask. At this time, since the metal layer MM is closely adhered the coating layer 7, it is possible to prevent the layers located under the metal layer MM from being undesirably scraped by, for example, an edging gas. After patterning, the masking tape MT is peeled off from the TFT layer 52. The laser L is applied from below the glass substrate GG to peel off the insulating basement 4 and the glass substrate GG. The flexible substrate 300 shown in FIG. 11 can be obtained by bonding the insulating basement 4 to the support film 8.

The above method of collectively patterning the insulating basement 4 using the metal layer MM as a mask can be applied to each of the manufacturing method of the first embodiment and the manufacturing method of the second embodiment.

As described above, according to the present embodiment, the flexible substrate capable of suppressing the infiltration of water into the electrical element and improving the reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the shape of the openings in the insulating basement 4 and the shape of the area formed by the scanning lines 1 and the signal lines 2 are not limited to those disclosed in the first to third embodiments. The insulating basement 4 does not need to include the line portions 42 that do not overlap with either the scanning lines 1 or the signal lines 2. Furthermore, the insulating basement 4 may partially include at least curved line portions in addition to the linear line portions.

What is claimed is:

1. A flexible substrate comprising:
an insulating basement;
a plurality of wiring lines provided on the insulating basement;
a plurality of electrical elements connected to the plurality of wiring lines; and
a metal layer,
the insulating basement including a plurality of line portions supporting the plurality of wiring lines, and a plurality of island-shaped portions supporting the plurality of electrical elements,
the plurality of line portions connecting the plurality of island-shaped portions,
the plurality of wiring lines and the electrical elements being located between the insulating basement and the metal layer, and
the metal layer covers an entirety of each of the plurality of electrical elements.

2. The flexible substrate of claim 1, further comprising:
a coating layer located between the insulating basement and the metal layer and extending along the line portions and the island-shaped portions,
wherein
the wiring lines and the electrical elements are located between the insulating basement and the coating layer, and
the metal layer is closely adhered to the coating layer.

3. The flexible substrate of claim 2, wherein
each of the electrical elements comprises a transparent electrode allowing light to be transmitted, an active layer covering the transparent electrode, and a reflective electrode located between the active layer and the coating layer to reflect light, and
the coating layer covers the reflective electrode and the active layer of each of the electrical elements.

4. The flexible substrate of claim 3, wherein
the metal layer is electrically connected to the reflective electrode.

5. The flexible substrate of claim 4, further comprising:
a first opening and a second opening surrounded by the plurality of line portions,
wherein
the first opening and the second opening have different shapes.

6. The flexible substrate of claim 5, further comprising:
a support film supporting the insulating basement, the insulating basement being located between the support film and the metal layer,
wherein
the support film overlaps with the first opening and the second opening in planar view.

7. The flexible substrate of claim 3, further comprising:
a first opening and a second opening surrounded by the plurality of line portions,
wherein
the first opening and the second opening have different shapes.

8. The flexible substrate of claim 7, further comprising:
a support film supporting the insulating basement, the insulating basement being located between the support film and the metal layer,
wherein
the support film overlaps with the first opening and the second opening in planar view.

9. The flexible substrate of claim 2, further comprising:
a first opening and a second opening surrounded by the plurality of line portions,
wherein
the first opening and the second opening have different shapes.

10. The flexible substrate of claim 9, further comprising:
a support film supporting the insulating basement, the insulating basement being located between the support film and the metal layer,
wherein
the support film overlaps with the first opening and the second opening in planar view.

11. The flexible substrate of claim 1, further comprising:
a first opening and a second opening surrounded by the plurality of line portions,
wherein
the first opening and the second opening have different shapes.

12. The flexible substrate of claim 11, further comprising:
a support film supporting the insulating basement, the insulating basement being located between the support film and the metal layer,
wherein
the support film overlaps with the first opening and the second opening in planar view.

13. A flexible substrate comprising:
an insulating basement;
a plurality of wiring lines provided on the insulating basement;
a plurality of electrical elements connected to the plurality of wiring lines; and
a metal layer,
the insulating basement including a plurality of line portions supporting the plurality of wiring lines, and a plurality of island-shaped portions supporting the plurality of electrical elements,
the plurality of line portions connecting the plurality of island-shaped portions,
the plurality of wiring lines and the electrical elements being located between the insulating basement and the metal layer, and
the metal layer covers an entirety of each of the plurality of electrical elements and an entirety of each of the plurality of wiring lines.

* * * * *